(12) United States Patent
Fujimoto et al.

(10) Patent No.: US 7,403,395 B2
(45) Date of Patent: Jul. 22, 2008

(54) POWER MODULE STRUCTURE AND SOLID STATE RELAY USING SAME

(75) Inventors: Takashi Fujimoto, Takeo (JP); Hiroto Nagaishi, Kashima (JP); Shoichi Konagata, Ureshino (JP)

(73) Assignee: OMRON Corporation, Kyoto (JP)

( * ) Notice: Subject to any disclaimer, the term of this patent is extended or adjusted under 35 U.S.C. 154(b) by 32 days.

(21) Appl. No.: 11/607,152

(22) Filed: Nov. 30, 2006

(65) Prior Publication Data

US 2007/0134976 A1    Jun. 14, 2007

(30) Foreign Application Priority Data

Dec. 14, 2005    (JP)    ............................ P2005-360018

(51) Int. Cl.
*H05K 7/20* (2006.01)
(52) U.S. Cl. ................... 361/707; 361/704; 361/719; 257/712; 257/713
(58) Field of Classification Search ................ None
See application file for complete search history.

(56) References Cited

U.S. PATENT DOCUMENTS

| | | | |
|---|---|---|---|
| 5,444,295 A * | 8/1995 | Lake et al. ................... 257/678 |
| 5,561,321 A | 10/1996 | Hirano et al. |
| 5,869,890 A * | 2/1999 | Nishiura et al. .............. 257/705 |
| 5,895,974 A * | 4/1999 | Eytcheson et al. .......... 257/723 |
| 5,920,119 A * | 7/1999 | Tamba et al. ................ 257/718 |
| 6,050,832 A | 4/2000 | Lee et al. |
| 6,297,549 B1 * | 10/2001 | Hiyoshi ........................ 257/703 |
| 6,501,172 B1 * | 12/2002 | Fukada et al. ................ 257/707 |
| 6,924,985 B2 * | 8/2005 | Kawakita et al. ............ 361/715 |
| 6,958,535 B2 * | 10/2005 | Hirano et al. ................ 257/707 |
| 7,035,105 B2 * | 4/2006 | Yamaguchi .................. 361/707 |
| 7,099,155 B2 * | 8/2006 | Kobayashi et al. .......... 361/719 |

FOREIGN PATENT DOCUMENTS

| | | |
|---|---|---|
| DE | 3931634 | 4/1991 |
| DE | 19540814 | 5/1997 |
| EP | 0631463 | 2/1998 |
| JP | 10-167804 | 6/1998 |

OTHER PUBLICATIONS

German patent application No. 10-2006-058-347, examination report dated Feb. 27, 2008.

* cited by examiner

*Primary Examiner*—Boris L Chervinsky
(74) *Attorney, Agent, or Firm*—Weaver Austin Villeneuve & Sampson LLP

(57) ABSTRACT

A power module structure has a heat plate for contacting a heat sink, an insulating plate soldered to the heat plate, a terminal soldered to the insulating plate and a semiconductor chip having a contact point corresponding to the terminal so as to contact the terminal through this contact point. The terminal is provided with a shock absorbing part that serves to weaken the force generated due to the difference in coefficient of thermal expansion between the terminal and the insulating plate. The terminal has a force restricting part that serves to restrict this force and is locally formed as a soldering area through which the terminal is soldered to the insulating plate. Such a structure is contained inside a base and makes a surface-contact with a heat sink to form a solid state relay.

16 Claims, 15 Drawing Sheets

POWER MODULE STRUCTURE AND SOLID STATE RELAY USING SAME

This application claims priority on Japanese Patent Application JP2005-360018 filed Dec. 14, 2005.

BACKGROUND OF THE INVENTION

This invention relates to a power module structure for an electronic component requiring a high level of reliability and heat-radiating capability, as well as to a solid state relay that uses such a power module structure.

As circuits are coming to be integrated in recent years, it is becoming a common practice to use a heat sink to remove heat from a heat-generating electronic component. For this reason, it is becoming an important technological problem to intimately contact an electronic component or a substrate to a heat sink for effectively removing heat. Since solder materials with a high melting point are coming to be used for reducing harmful substances to be used, however, the problem of warping (or bending deformation) is coming to be seriously considered because a warp makes the aforementioned intimate contact difficult to achieve.

It has also been known that a warp may result if a plurality of planar members having different coefficients of thermal expansion are soldered together. Solders of different kinds having different melting points generate different kinds of warps, and this effect becomes more pronounced as the melting point becomes higher. Solders with high melting points usually contain Pb as the main component. Since Pb is a soft material, it has been known to serve as a counter-measure against the problem of warping. FIG. 24 shows a power module structure of a conventional kind for a heat-generating electronic component. As can be see more clearly in FIG. 25, it is structured by soldering a heat plate 1 for contacting a heat sink (not shown) to an insulating plate 2, soldering a terminal (first terminal) 4 to this insulating plate 2, soldering a semiconductor chip 3 to the first terminal 4 so as to connect this first terminal 4 to a corresponding contact point of the semiconductor chip 3, and soldering other terminals (second and third terminals) 5 and 6 to the semiconductor chip 3 so as to connect the second and third terminals 5 and 6 each to a corresponding one of the contact points of the semiconductor chip 3. The first terminal 4 comprises an elongated main body 4A having a terminal part 4B at its tip. The heat plate 1 is adapted to be attached to the surface of the heat sink by screwing its attachment parts 7 to the heat sink surface.

In FIG. 26, symbol 1A indicates a main body part of the heat plate 1, provided with a rectangular soldering area 10-1 indicated by dotted lines over which the insulating plate 2 is attached. In FIG. 27, dotted lines 10-2 indicate another rectangular solder area on the insulating plate 2 over which the first terminal 4 is attached by soldering. In FIG. 28, dotted lines 10-3 indicate still another rectangular area defined at a center part of the main body 4A of the first terminal 4 over which the semiconductor chip 3 is attached by soldering. In FIG. 29, dotted lines 10-4 and 10-5 respectively indicate a triangular soldering area and a rectangular solder area defined on the semiconductor chip 3, respectively for attaching the second and third terminals 5 and 6 by soldering.

In the above, the soldering may be carried out by heating the heat plate, 1, the insulating plate 2, the semiconductor chip 3 and the first, second and third terminals 4, 5 and 6 as they are in the layered conditions so as to melt and harden the solder on each of the soldering areas 10-1-10-5. Alternatively, the soldering between the heat plate 1 and the insulating plate 2, that between the insulating plate 2 and the first terminal 4, that between the first terminal 4 and the semiconductor chip 3, and that between the semiconductor chip 3 and the second and third terminals 5 and 6 may be separately carried out. After a module structure 11 is thud formed by soldering, it is molded by means of a resin material 12 to obtain the power module structure shown in FIG. 24.

A mechanism for generating a warp in the insulating plate 2 and the first terminal 4 in the case of the power module structure thus formed as described above will be explained next with reference to FIGS. 30-33.

FIG. 30 shows schematically an example wherein the insulating plate 2 comprises $Al_2O_3$ and the first terminal 4 comprises Cu and is attached to the insulating plate 2 by using solder 10. The standard length of the insulating plate 2 is indicated by L1 and that of the first terminal 4 by L2. As temperature is raised from room temperature (25° C.) to $T_p$, the thermal expansion of the insulating plate 2 is nominal because of its material but the first terminal 4 expands outward as indicated by arrows F1, becoming longer than its standard length.

As temperature drops from $T_p$ to $T_m$ (>25° C.), the first terminal 4 shrinks as indicated by arrows F2 in FIG. 31. As temperature drops further from $T_m$, the first terminal 4 shrinks as shown by arrows F3 in FIG. 32. As temperature returns to 25° C., since the solder 10 hardens while the first terminal 4 is in an elongated condition, the first terminal 4 and the insulating plate 2 warp so as to become convex to the downward direction.

Explained more in detail, since the solder 10 has a very high melting point of about 300° C. (as compared to prior art solder with melting point of about 180° C.), the solder 10 becomes hardened at about 300° C. to connect the first terminal 4 with the insulating plate 2 when the first terminal 4 is in a thermally expanded condition while the insulating plate 2 is nearly of the original length. Thus, as temperature drops and both the first terminal 4 and the insulating plate 2 return to their original lengths, only the first terminal 4 shrinks and a warp results such that the first terminal 4 and the insulating plate 2 become convex to the downward direction.

Japanese Patent Publication Tokkai 10-167804 discloses a method of producing a circuit board for mounting to a heat-generating component such as a power module structure, characterized as using a sintered ceramic substrate bending in one direction by 1/4000-1/100 of the length in that direction and in the perpendicular direction by ½ or less (inclusive of zero) of the bending in that direction, placing a circuit-forming metallic plate on the convex side of the ceramic substrate and a metallic plate for forming a heat-dissipating part on the concave side of the ceramic substrate and heating them to join them together such that the residual force generated at the time of producing the circuit substrate, such as when it is attached to the copper plate of the heat sink, can be increased.

With a prior art power module structure as described above, warping takes place due to the difference in the coefficient of thermal expansion, causing a gap to appear between the heat plate 1 and the heat sink, thereby adversely affecting the efficiency of heat radiation. If the power module structure is structured such that the first terminal is curved, as described above, heat is transmitted to the side where it is bent less and the solder 10 is subjected to an excessive stress. This gives rise to the problem of material fatigue.

Since the soldering area for applying solder covers the entire surface as shown by dotted lines in FIG. 27, furthermore, the deformation takes place mainly on the outer side. This means that the force corresponding to the entire length of the soldering area will be on the first terminal 4, causing it to warp.

SUMMARY OF THE INVENTION

It is therefore an object of this invention in view of these problems to provide a power module structure and a solid state relay using such a structure capable of restricting the force that causes the terminal to warp such that the problem of heat-radiating characteristic and the problem of heat shock on the finished product can be eliminated.

A power module structure according to the present invention is characterized as comprising a heat plate for contacting a heat sink, an insulating plate soldered to the heat plate, a terminal soldered to the insulating plate and a semiconductor chip having a contact point corresponding to the terminal so as to contact the terminal through this contact point and wherein the terminal is provided with a shock absorbing part that serves to weaken the force generated due to the difference in coefficient of thermal expansion between the terminal and the insulating plate and the terminal has a force restricting part that serves to restrict this force and is locally formed as a soldering area through which the terminal is soldered to the insulating plate.

The force restricting part may be formed on one side or on both sides of the terminal. The shock absorbing part may be formed as a plurality of slits provided to the terminal. The shock absorbing part may be provided by dividing the terminal into a plurality of parts in a longitudinal direction of the terminal, the divided parts being separately soldered to the insulating plate to thereby disperse the force restricting part. The shock absorbing part may be formed alternatively as a groove on either surface of the terminal.

The heat plate may include a shock absorbing portion also serving to weaken the force generated due to the difference in coefficient of thermal expansion between the terminal and the insulating plate.

A solid state relay of this invention may be characterized as comprising a heat sink, a base attached to an end surface of the heat sink and a power module structure of this invention.

DETAILED DESCRIPTION OF THE INVENTION

Figure 1:
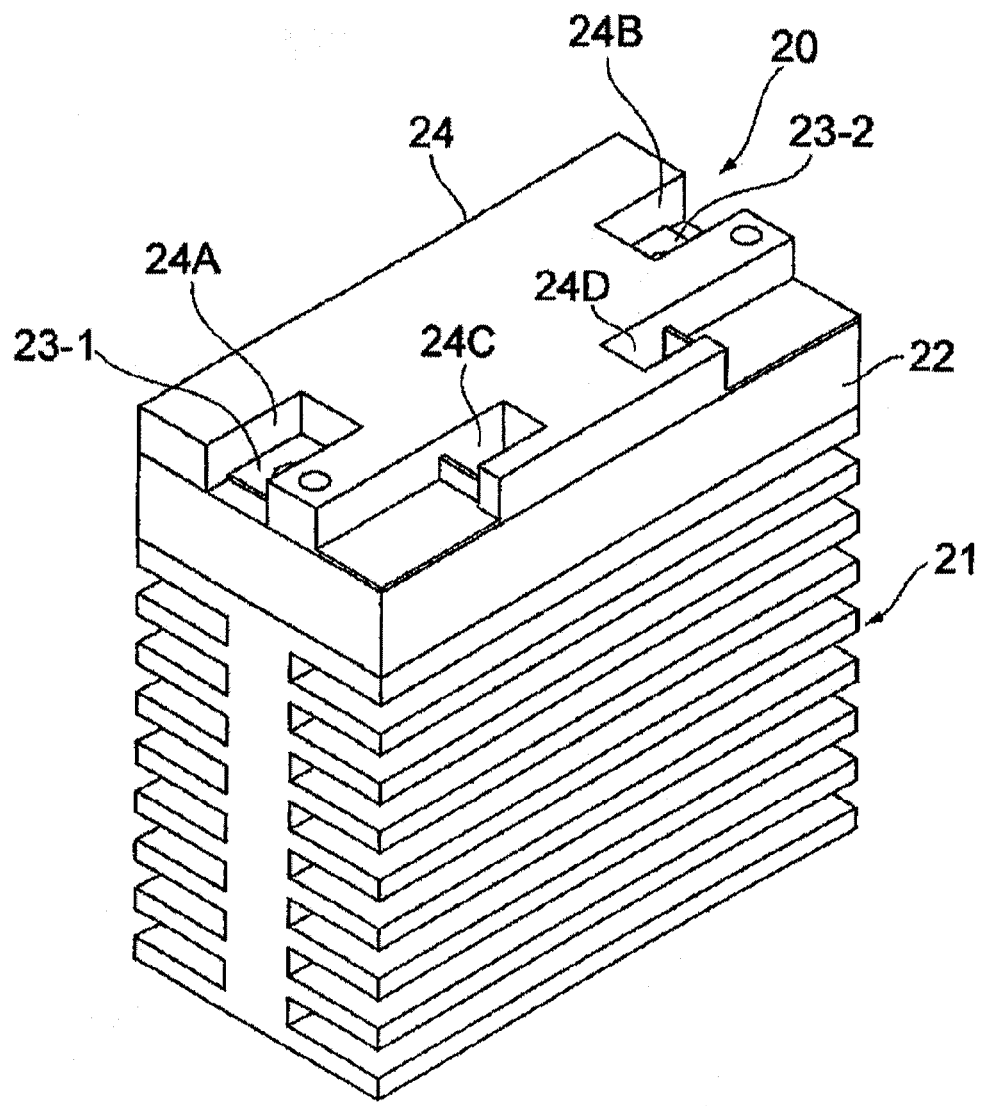
FIG. 1 is a diagonal view of a solid state relay using a power module structure of this invention.
Figure 2:
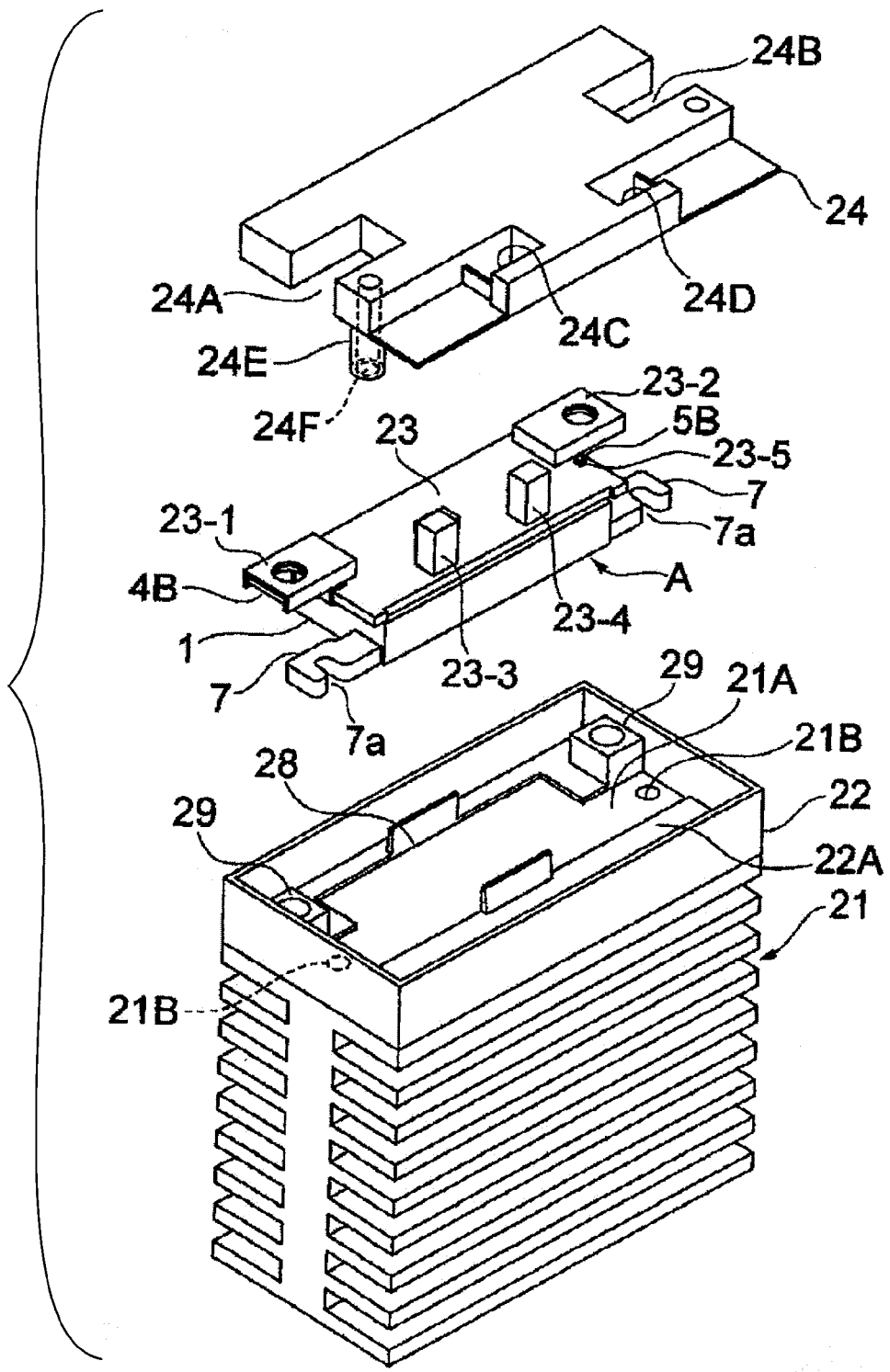
FIG. 2 is an exploded view of the solid state relay of FIG. 1.

The invention is described next with reference to a solid state relay 20 shown in FIG. 1 which makes use of a power module structure embodying this invention. As shown more in detail in FIG. 2, this solid state relay 20 is provided with a heat sink 21, a base 22 attached to an end surface 21A of this heat sink 21, a power module structure A of this invention which is contained within this base 22 and makes a surface-contact with the heat sink 21, a circuit board 23 connected to this power module structure A and a case 24 which is removably engaged with the base 22 and serves to cover the circuit board 23. A cover (not shown) is provided to this case 24 so as to be free to undergo a swinging motion.

The end surface 21A of the heat sink 21 is provided with screw holes 21B on both sides in its longitudinal direction. The base 22 is structured in the form of a box, having the same shape as the end surface 21A of the heat sink 21. An attachment part 28 opens to the bottom part 22A of the base 22. Terminal receiving parts 29 are provided on both sides of the bottom part 22A of the base 22 in its longitudinal direction.

The circuit board 23 is provided with a pair of terminal parts 23-1 and 23-2 at both end parts in its longitudinal direction and another pair of terminal parts 23-3 and 23-4 on its mounting surface. A gate terminal connecting part 23-5 is also provided to the circuit board 23.

The case 24 is provided with terminal windows 24A and 24B on both end parts in its longitudinal direction and a pair of terminal openings 24C and 24D on one of the side edges. Protrusions 24E are also provided to both end parts in the longitudinal direction, protruding downwards from the case 24. A screw hole 24F is formed at the tip of each of these protrusions 24E.

The base 22 is set to the end surface 21A of the heat sink 21 and the power module structure A is mounted to the attachment part 28 of the base 22 such that grooves 7a formed on the attachment parts 7 of the power module structure A overlap with the screw holes 21B of the heat sink 21, the back surface of the heat plate 1 of the power module structure A contacts the end surface 21A of the heat sink 21 and terminal parts 4B and 5B of the power module structure A come to be along terminal receiving parts 29 of the base 22.

The circuit board 23 is superposed on the power module structure A such that terminal parts 23-1 and 23-2 overlap with terminal parts 4B and 5B of the power module structure A and the gate terminal part 5B of the power module structure A becomes connected to the gate terminal connecting part 23-5 of the circuit board 23.

The case 24 is attached to the base 22 so as to cover the circuit board 23. Terminal part 23-1 and a terminal screw (not shown) appear at one of the terminal windows 24A of the case 24, and terminal part 23-2 and another terminal screw (not shown) appear at the other of the terminal windows 24B. Terminal parts 23-3 and 23-4 of the circuit board 23 are inserted into the terminal openings 24C and 24D. The protrusions 24E of the case 24 press down the attachment parts 7 of the heat plate 1 and the attachment parts 7 of the heat plate 1 become attached to the heat sink 21 as the screws (not shown) inserted into the screw holes 24F are engaged to the screw holes 21B of the heat sink 21.

Figure 3:
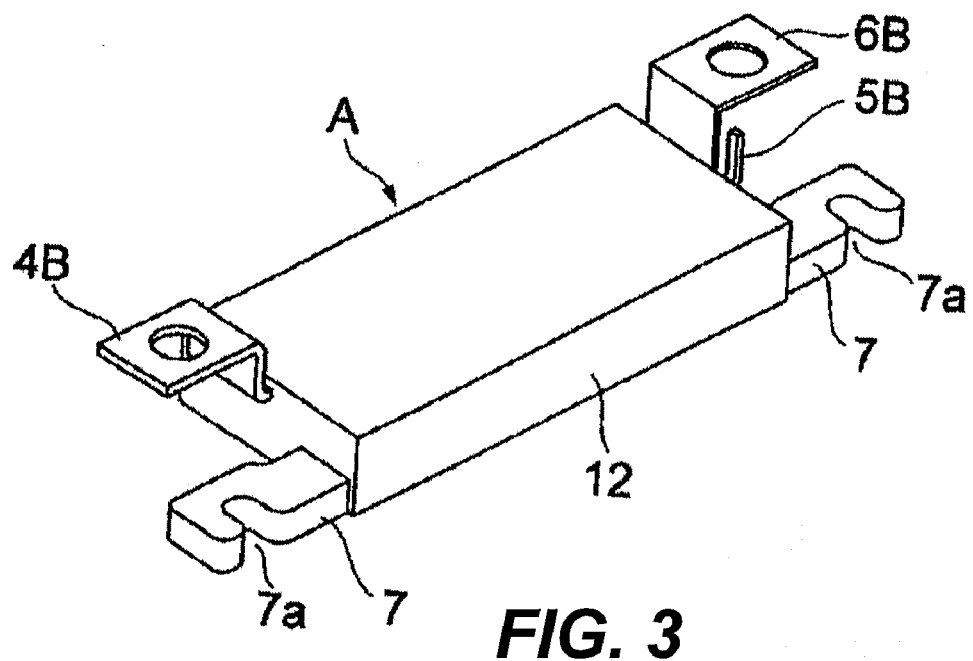
FIG. 3 is a diagonal view of a power module structure according to a first embodiment of this invention.
Figure 4:
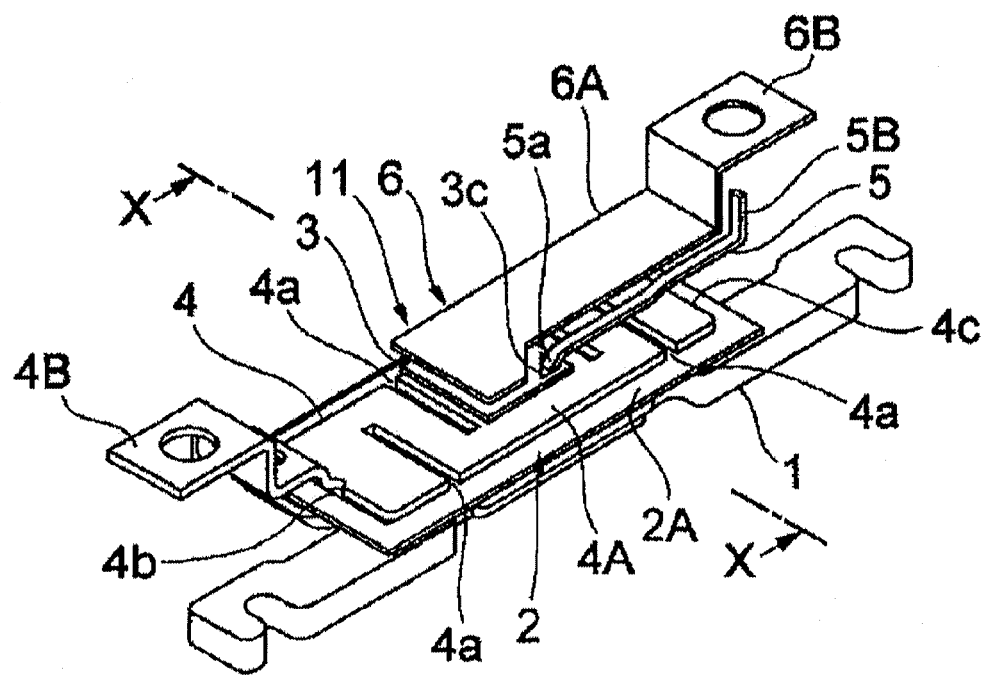
FIG. 4 is a diagonal view of the power module structure of FIG. 3 with the resin mold removed.

As shown in FIGS. 3 and 4, the power module structure A comprises a single-phase heat plate 1, an insulating plate 2, a semiconductor chip 3, a first terminal 4, a second terminal 5 and a third terminal 6.

Figure 6:
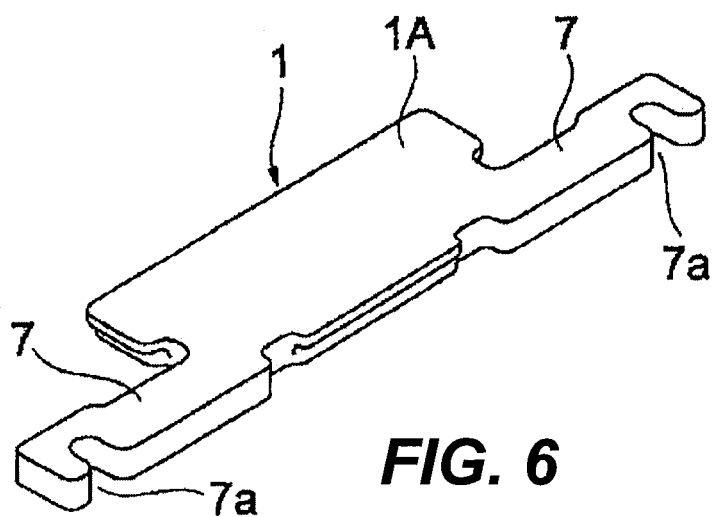
FIG. 6 is a diagonal view of the heat plate.

The heat plate 1 comprises a Cu material. As shown in FIG. 6, attachment parts 7 for attaching to the heat sink 21 extend longitudinally from both end parts of its main body 1A, each attachment part 7 having a groove 7a for screwing it to the heat sink. As shown in FIG. 4, the insulating plate 2 has a metallic layer (not shown) formed on both surfaces of its planar main body 2A by vapor deposition of a metallic material such as molybdenum or manganese so as to allow soldering.

Figure 5:
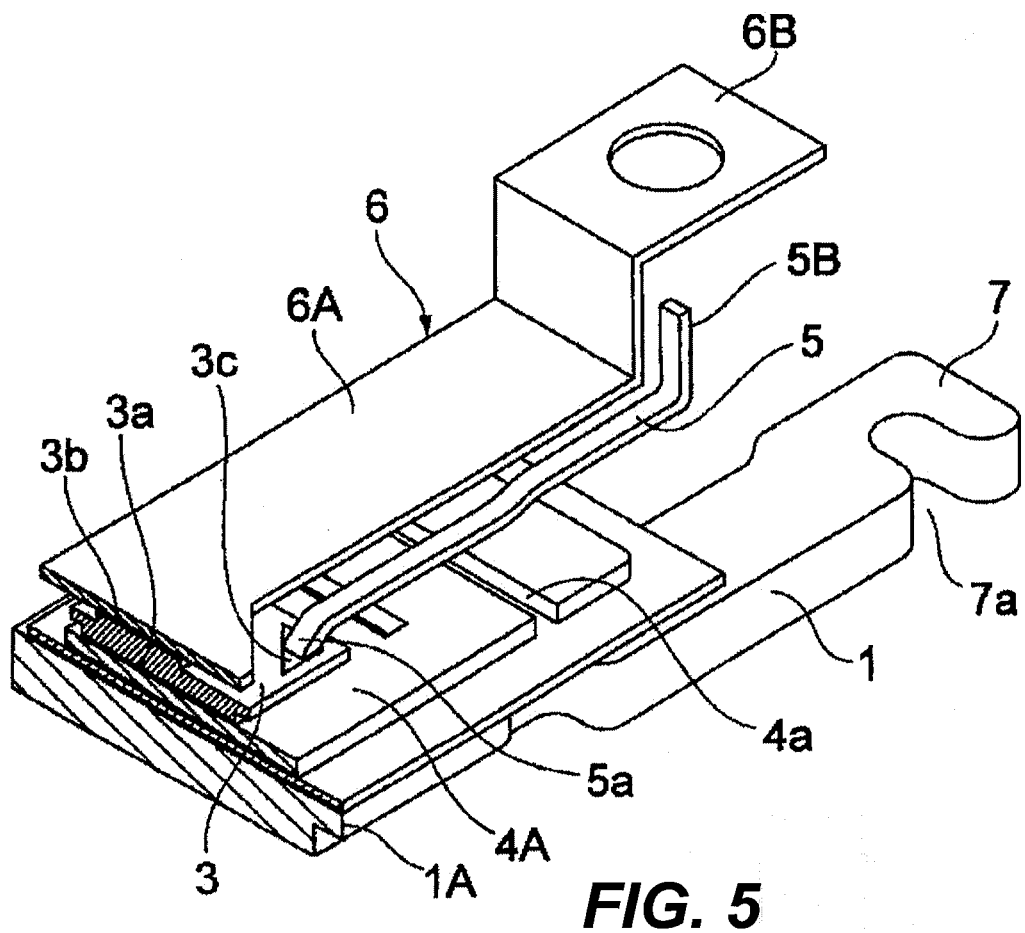
FIG. 5 is a diagonal view of the power module structure of FIG. 4 at the position of the cross-sectional plane indicated by line X-X of FIG. 4.

The semiconductor chip 3 may be a triac (not shown) serving as an output element. It may be of a quadrangular planar shape, having first and second contact points 3a and 3b and a gate contact point 3c, as shown in FIG. 5.

Figure 7:
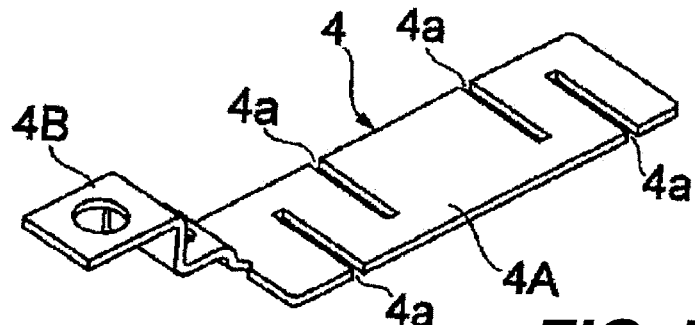
FIG. 7 is a diagonal view of the first terminal.

As shown in FIG. 7, the first terminal 4 comprises an elongated main body 4A having a pair of slits 4a formed on each of its side edges, serving as shock absorbers. One end part of the terminal main body 4A is bent in the shape of a crank so as to form a terminal part 4B.

The second terminal 5 is a so-called gate terminal. It is elongated as shown in FIG. 4 with its base end part serving as a connecting part 5a and its tip bent and serving as a terminal part 5B. The third terminal 6 is provided with a wide band-shaped main body 6A, as shown in FIG. 4. Its end part is bent in the shape of a crank so as to form a terminal part 6B.

The insulating plate 2 is soldered to the main body 1A of the heat plate 1. The planar main body 2A of the insulating plate 2 has only one side of the main body 4A of the first terminal 4 (the side of its base end part 4b) soldered thereto, as shown in FIG. 4, by using it as a localized soldering area.

FIG. 4 also shows the semiconductor chip 3 soldered to a center part of the main body 4A of the first terminal 4, the second terminal 5 being soldered thereto through its contact part 5a at its base end part and the third terminal 6 at its base end part. The module structure 11 thus formed by soldering is molded by means of a resin 12 to form the power module structure A in FIG. 3.

As explained above, the planar main body 2A of the insulating plate 2 and the first terminal 4 are attached to each other by soldering only the end part 4b of the terminal main body 4A of the first terminal 4. Since this solder is formed locally only within a smaller soldering area than a conventional soldering area, the force on the first terminal 4 becomes narrowly localized. Thus, this solder-contacting end part 4b serves as a force restricting part embodying this invention.

In summary, as shown in FIG. 3, the power module structure A has the terminal parts 4B and 6B of the first and third terminals 4 and 6 protruding on both sides in its longitudinal direction, the gate terminal part 5B of the second terminal 5 protruding from its surface, and the attachment parts 7 of the heat plate 1 protruding from both sides in the longitudinal direction for attaching to the heat sink 2. With the power module structure A thus structured, since solder is applied to the planar main body 2A of the insulating plate 2 only at the end part 4b of the main body 4A of the first terminal 4 serving as the soldering area, the application of force thereon becomes localized. Moreover, since shock absorbers in the form of slits 6a are provided to the first terminal 4, the force that causes it to warp is weakened and hence its warping (or bending) deformation is reduced. This means that the contact of the heat plate 1 with the heat sink is improved.

Other merits of this invention include elimination of stress on the solder causing fatigue and improvement in the useful lifetime of the structure.

As an alternative, the main body 4A of the first terminal 4 may be attached to the planar main body 2A of the insulating plate 2 through both end parts 4b and 4c (with reference to FIG. 4). In this case, the soldering areas at these end parts 4b and 4c serve as force restricting parts of this invention.

Figure 8:
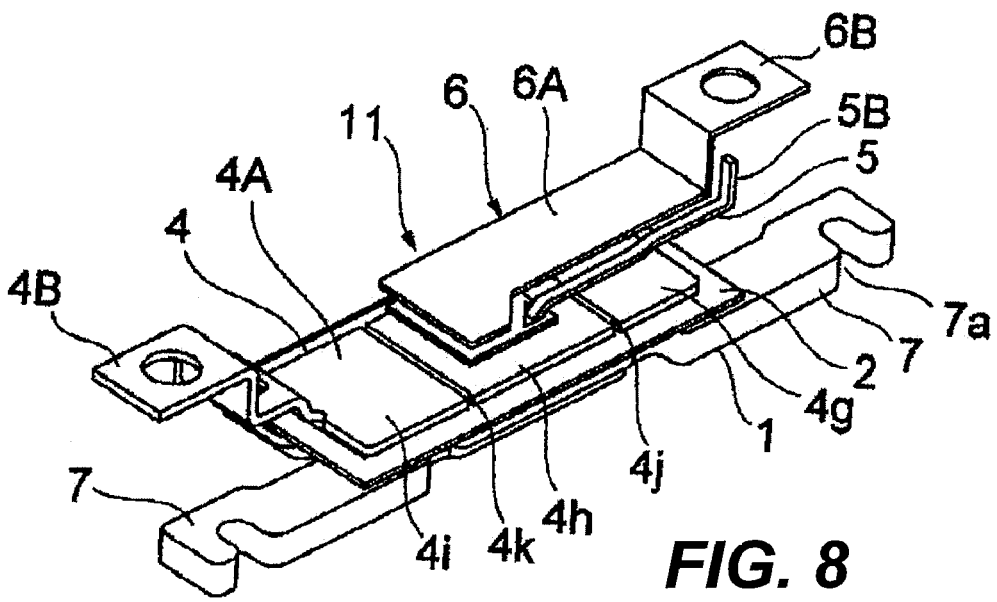
FIG. 8 is a diagonal view of a power module structure according to a second embodiment of the invention with the resin mold removed.

A second embodiment of this invention is described next with reference to FIGS. 8 and 9 wherein like or equivalent components are indicated by the same symbols as used above for describing the first embodiment of the invention.

Figure 9:
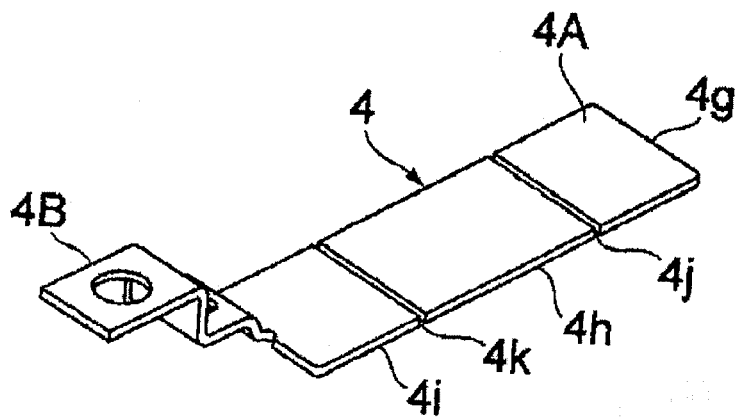
FIG. 9 is a diagonal view of a first terminal to be used in the power module structure of FIG. 8.

According to the second embodiment, as shown in FIG. 9, the main body 4A of the first terminal 4 is divided into three parts which are a base part 4g, a center part 4h and a tip part 4i. These three parts 4g, 4h and 4i are each locally soldered to the insulating plate 2. A straight-line dividing part 4j between the base part 4g and the center part 4h and another straight-line dividing part 4k between the center part 4h and the tip part 4i serve as shock absorbers of this invention to reduce the force which tends to cause a warping deformation. In other aspects, the second embodiment is the same as the first embodiment.

Figure 10:
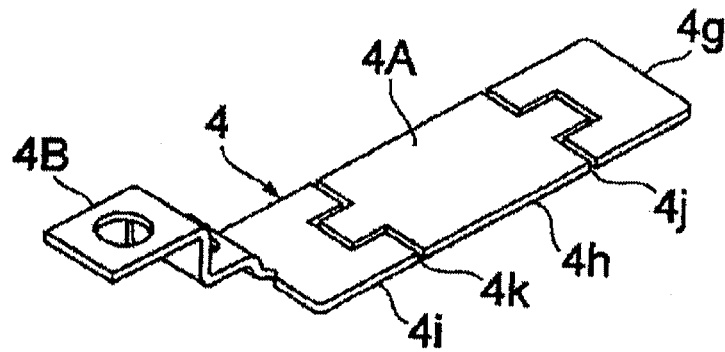
FIG. 10 is a diagonal view of another example of first terminal.
Figure 11:
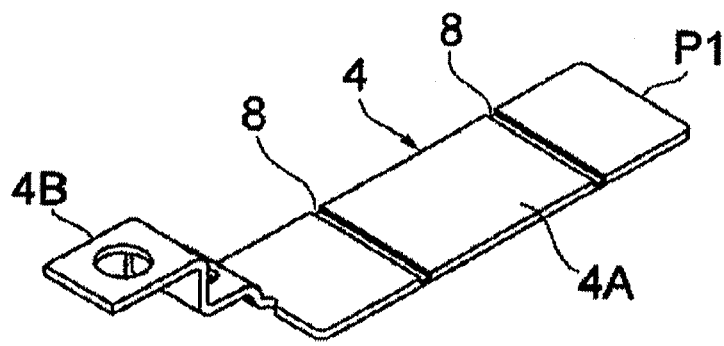
FIGS. 11 and 12 are diagonal views of other examples of first terminal.

As a variation, the dividing parts 4j and 4k may be formed as shown in FIG. 10 into a key-shape. As another variation, shock absorbers for the first terminal 4 may be formed, as shown in FIG. 11, as a plurality of grooves 8 provided perpendicularly to its direction of elongation on its surface P1. The first terminal 4 thus provided with the grooves 8 are soldered to the insulating plate 2 by applying solder over a smaller soldering area on the back surface than conventionally done. The grooves 8 serving as shock absorbers and the smaller soldering area for attaching the first terminal to the insulating plate 2 serve to reduce the force that causes the warping and hence the contact characteristic between the heat plate 1 and the heat sink is improved.

Figure 12:
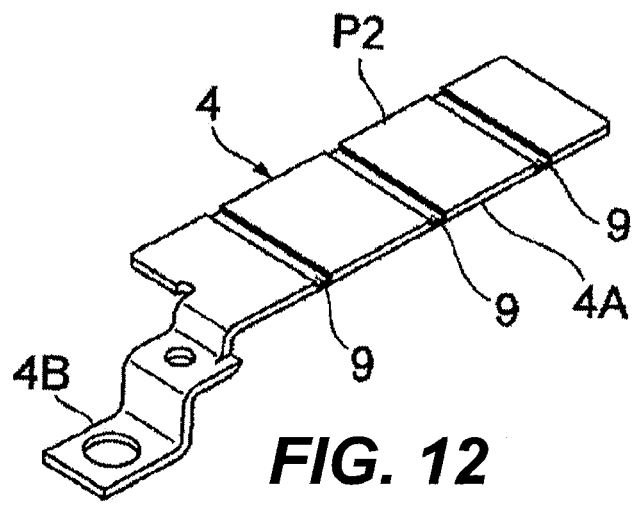

FIG. 12 shows still another variation characterized as providing a plurality of grooves 9 as shock absorbers formed perpendicularly to the direction of elongation of the first terminal 4 on the back surface P2 of its main body 4A. The first terminal 4 thus formed is also soldered to the insulating plate 2 by applying solder only locally over a smaller soldering area than conventionally done.

Figure 13:
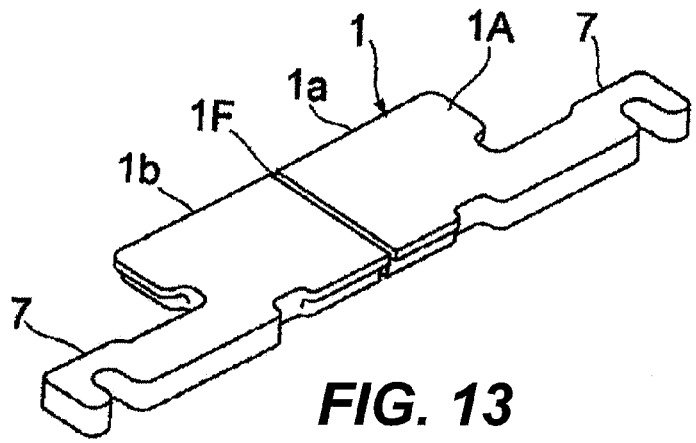
FIG. 13 is a diagonal view of another example of heat plate.

The examples described above are all characterized wherein the heat plate 1 itself is not provided with any shock absorbing means. FIG. 13 shows an example wherein the planar main body 1A of the heat plate 1 is divided into two parts 1a and 1b such that the dividing part 1F therebetween serves as shock absorber. Each of the divided parts 1a and 1b is individually soldered to the insulating plate 2 such that the force restricting part becomes dispersed. By this example, too, the shock absorber in the form of the dividing part 1F serves to weaken the force that causes the warping and the heat plate 1 is soldered to the main body 2A of the insulating plate 2 over a smaller soldering area than conventionally done. Thus, the occurrence of a warp is reduced and the contacting characteristic of the heat plate 1 with the heat sink is improved.

Figure 14:
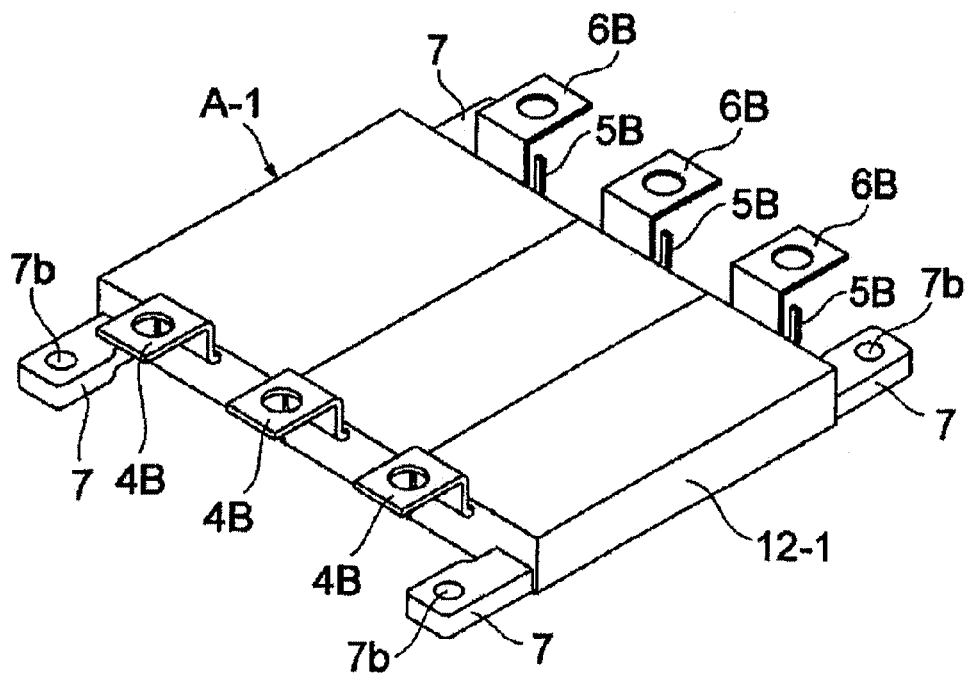
FIG. 14 is a diagonal view of a power module structure according to a third embodiment of the invention.
Figure 15:
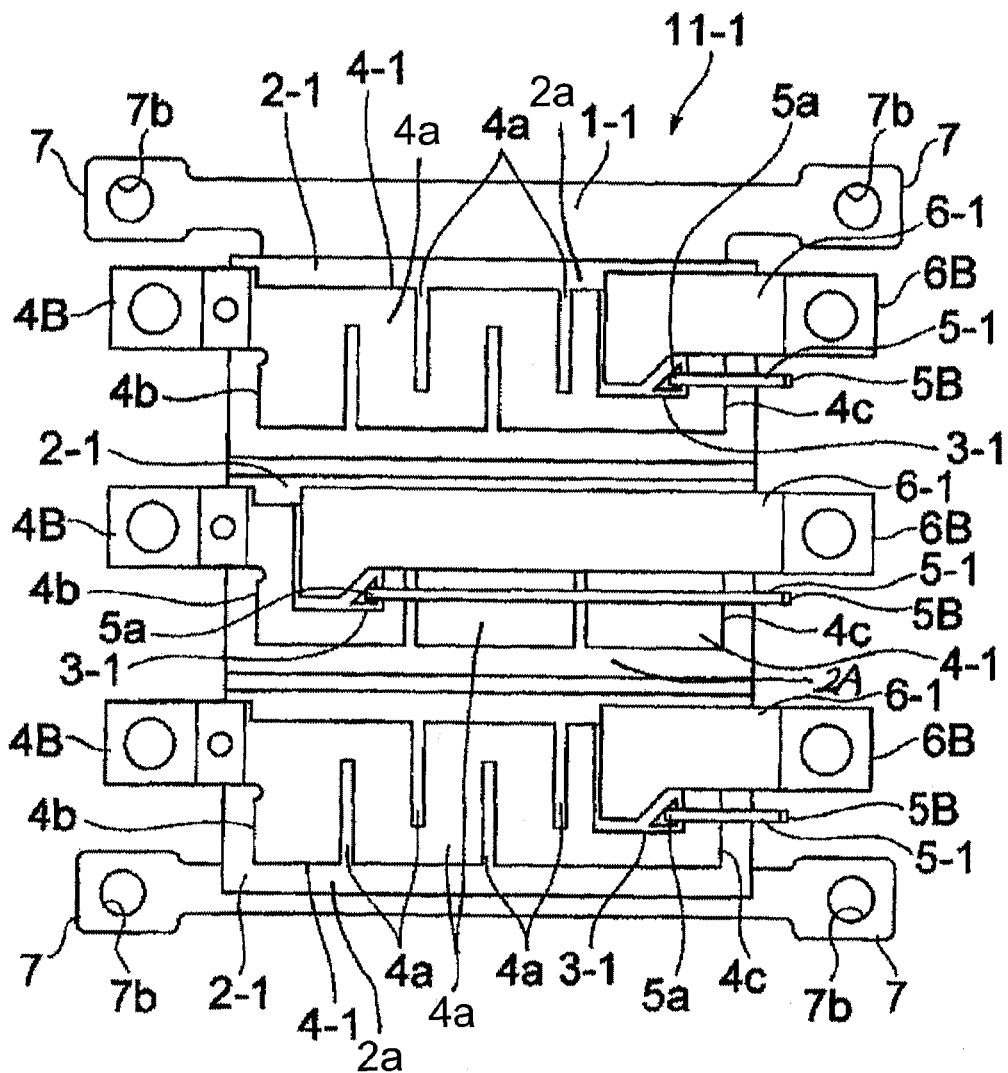
FIG. 15 is a plan view of the power module structure of FIG. 14 with its resin mold removed.
Figure 16:
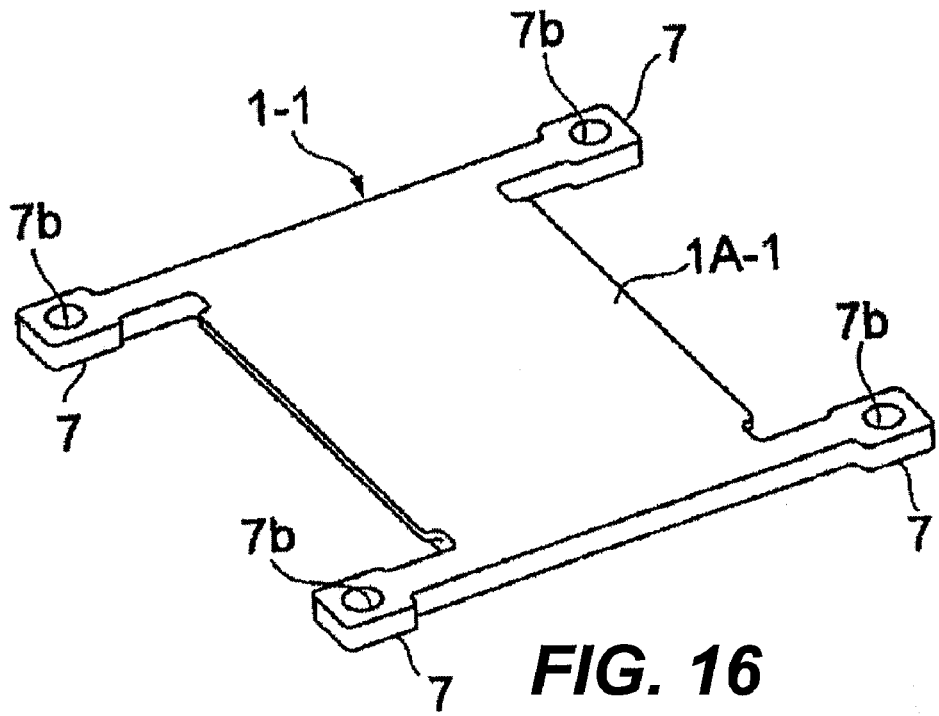
FIG. 16 is a diagonal view of the heat plate of the power module structure of FIG. 14.

A third embodiment of the invention is described next with reference to FIGS. 14-16. As shown in FIG. 15, a power module structure A-1 according to this embodiment is of a three-phase structure, being provided with a heat-plate 1-1, insulating plates 2-1, semiconductor chips 3-1, first terminals 4-1, second terminals 5-1 and third terminals 6-1. Since each of the insulating plates 2-1, semiconductor chips 3-1, first terminals 4-1, second terminals 5-1 and third terminals 6-1 are respectively the same as the insulating plate 2, semiconductor chip 3, first terminal 4, second terminal 5 and third terminal 6 described above, they will not be repetitiously described.

The heat plate 1-1 comprises a Cu material. As shown in FIG. 16, an attachment part 7 extends from each of four corners of its planar main body 1A, and each attachment part 7 has an attachment hole 7b formed therethrough for screwing to the heat sink.

The three insulating plates 2-1 are soldered to the planar main body 1A-1 of the heat plate 1-1, and each of these insulating plates 2-1 has on its main body 2A end parts 4b and 4c of the main body 4A of the corresponding one of the first terminals 4-1 soldered on its localized soldering area.

A semiconductor chip 3-1 is soldered at a center part of the main body 4A of each first terminal 4-1. A second terminal 5-1 and a third terminal 6-1 are soldered to each of the semiconductor chips 3-1 respectively through its contact point 5a and its base end part. The module structure 11-1 thus formed by soldering is molded by means of a resin material 12-1 to obtain a power module structure A-1.

In summary, the planar main body 2A of each of the insulating plates 2-1 is soldered to the end parts 4b and 4c of the main body 4A of the corresponding one of the first terminals 4-1 by applying solder locally over smaller soldering areas than conventionally done. Thus, the force that will be applied to each first terminal 4-1 becomes localized and these smaller soldering areas through which contacts are made serve as force restricting parts of this invention.

As shown in FIG. 13, this power module structure A-1 has not only the terminal parts 4B and 6B of each of the first and third terminals 4-1 and 6-1 on both sides in its longitudinal direction but also the gate terminal part 5B of the second terminal 5-1 protruding on the side of its surface. It also has attachment parts 7 protruding on both sides in its longitudinal direction for attaching the heat sink (not shown).

As described above, shock absorbers in the forms of a plurality of slits 4a are formed on each of the first terminals 4-1 such that the force that tends to cause warping is reduced. Moreover, the attachment between each insulating plate 2-1 and its corresponding first terminal 4-1 is over smaller soldering areas than conventionally done such that the generation of force that causes a warp becomes restricted.

Although an example was explained above wherein each of the first terminals 4-1 is provided with a plurality of slits 4a serving as shock absorbers, shock absorbers may be formed in various other forms such as shown in FIG. 9 by dividing the main part 4A of the first terminal 4-1 into three parts 4g, 4h and 4i, as shown in FIG. 10 by forming dividing parts 4j and 4k in a key-shape, as shown in FIG. 11 by providing the surface P1 with grooves 8 perpendicularly to the longitudinal direction, or as shown in FIG. 12 by providing grooves 9 perpendicularly to the longitudinal direction on the back surface of the main body 4A.

Figure 17:
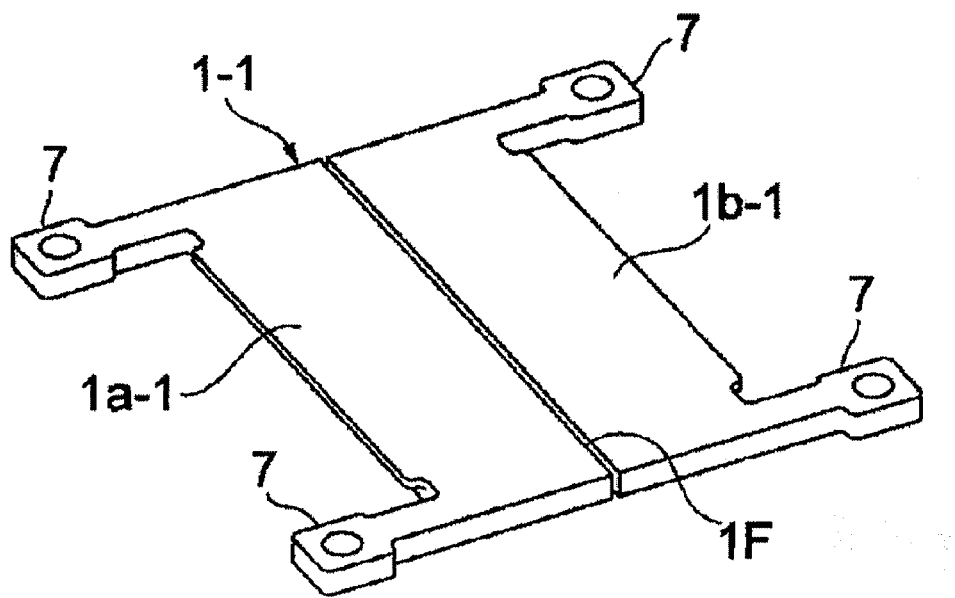
FIGS. 17-23 are diagonal views of other examples of heat plate.

Although a heat plate 1-1 having no shock absorber on itself was shown in FIG. 15, a heat plate with a shock absorbing means may be utilized. FIG. 17 shows an example of heat plate having its main body 1A divided into two parts 1a-1 and 1b-1 which are individually soldered to the corresponding insulating plate 2-1 each over a smaller soldering area than a conventional soldering area such that its force restricting part is dispersed and the dividing part 1F serves as shock absorber.

Figure 18:
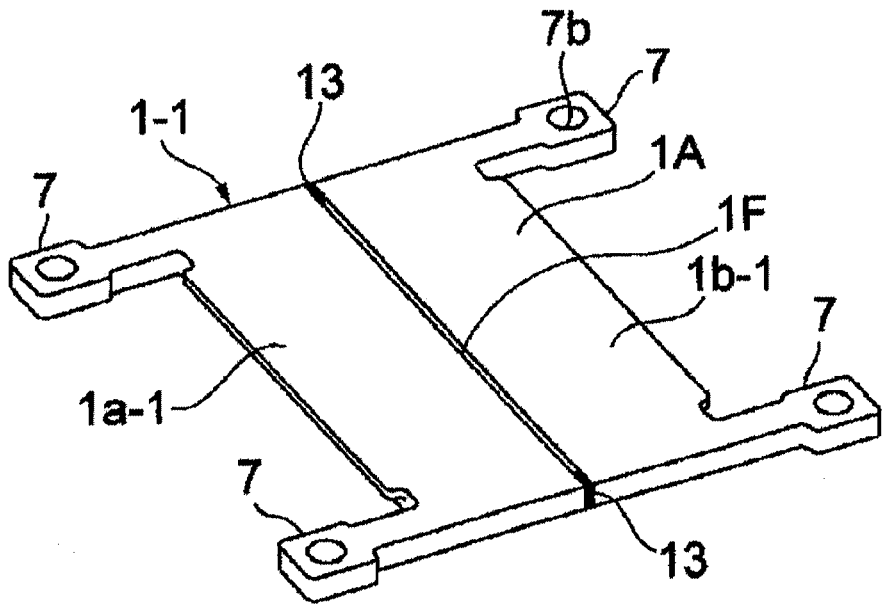
Figure 19:
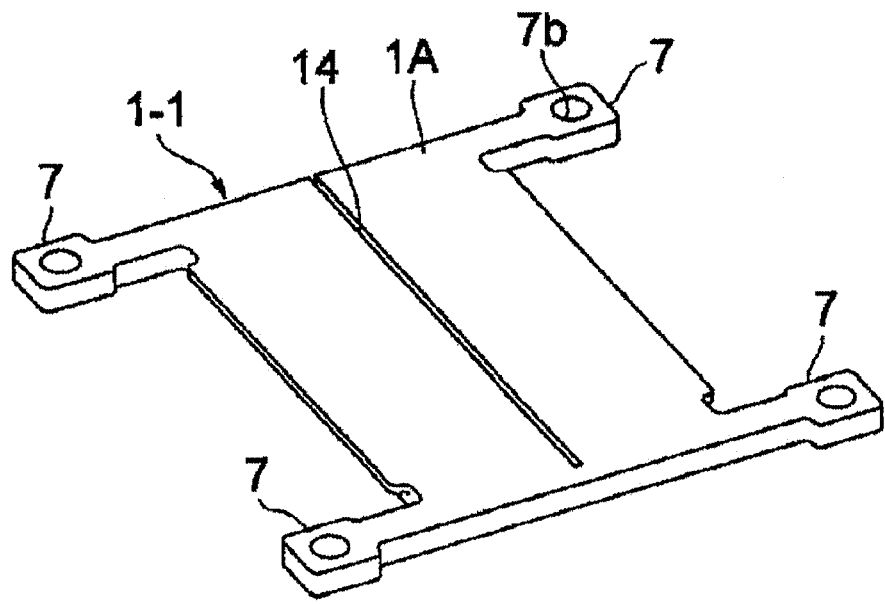
Figure 20:
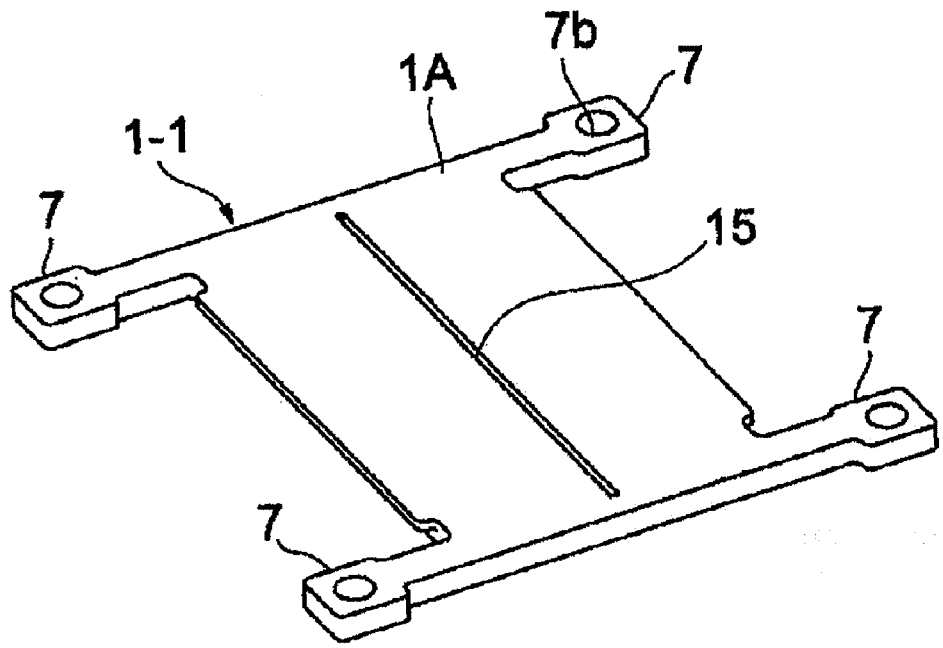
Figure 21:
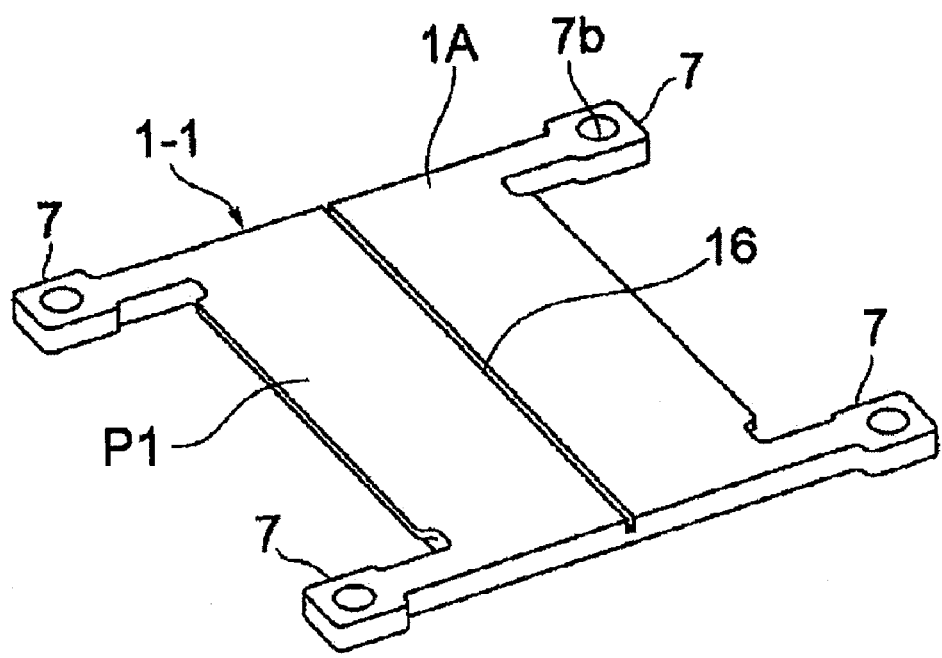
Figure 22:
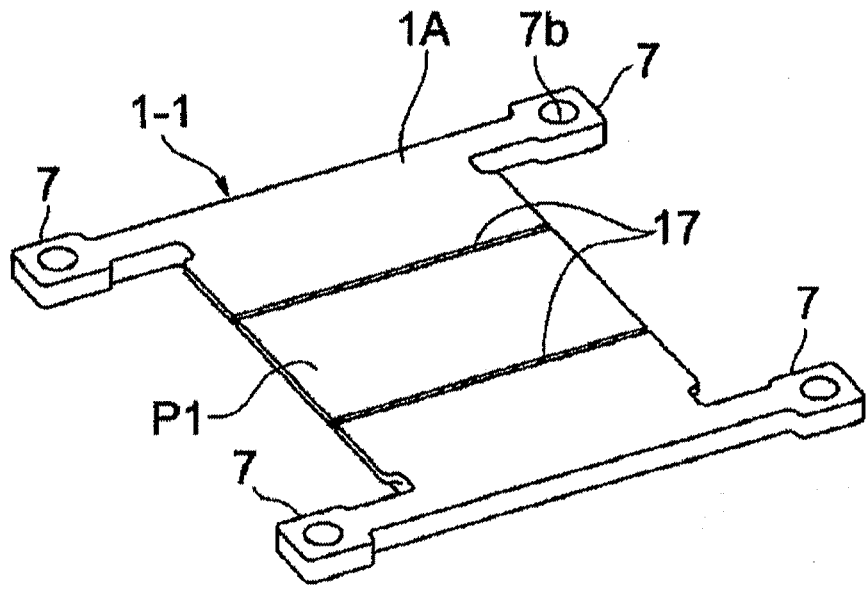
Figure 23:
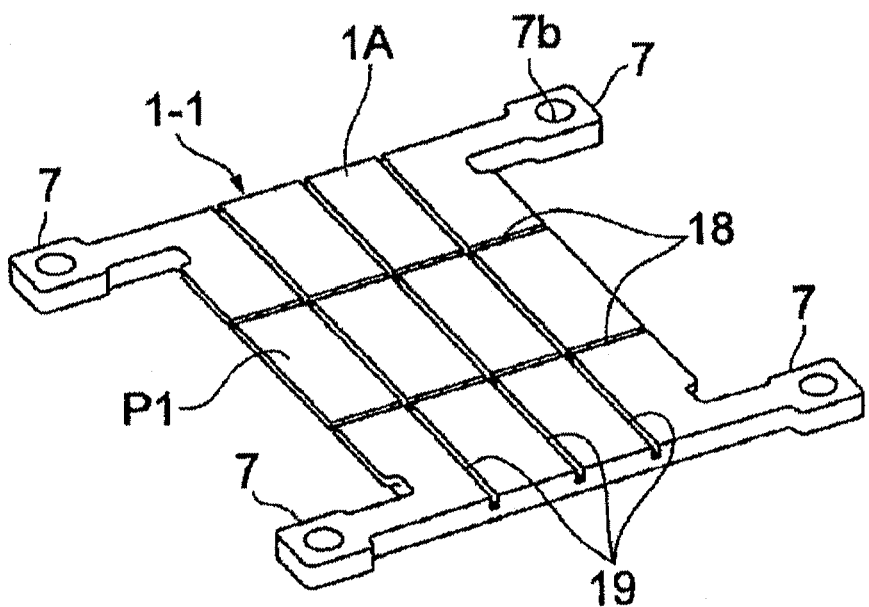
Figure 24:
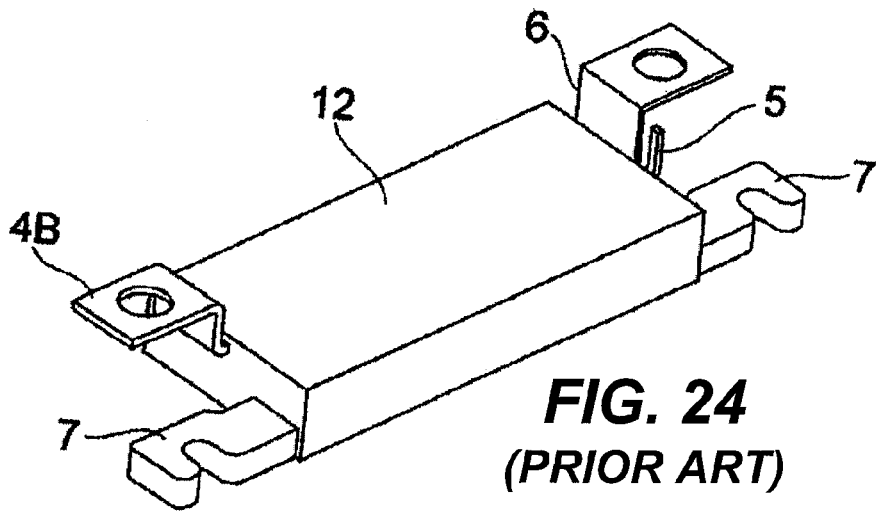
FIG. 24 is a diagonal view of a prior art power module structure.
Figure 25:
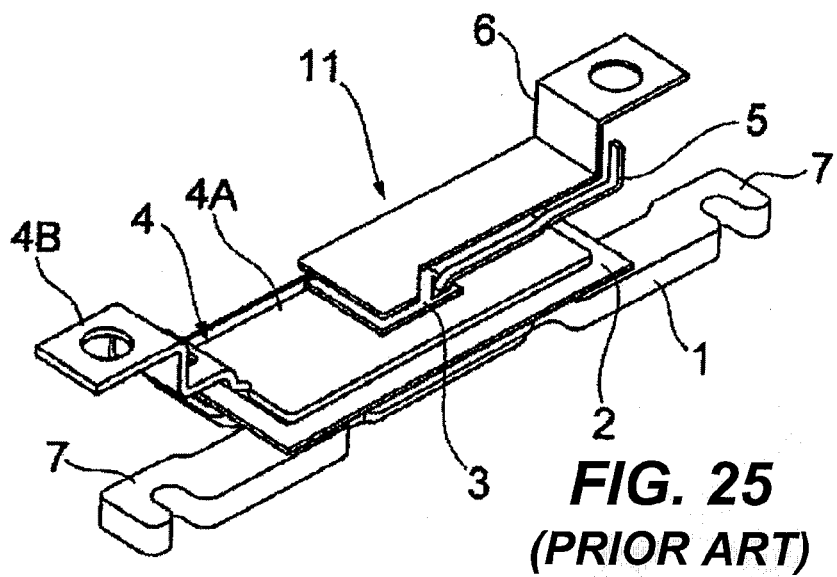
FIG. 25 is a diagonal view of the prior art power module structure of FIG. 24 with its resin mold removed.
Figure 26:
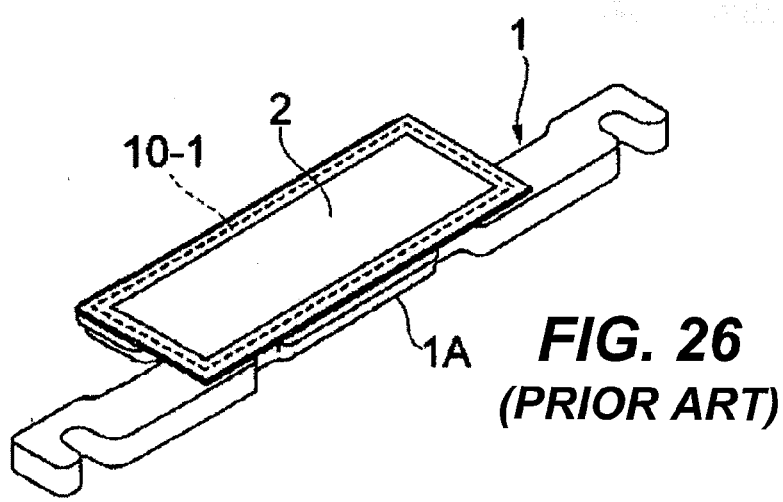
FIG. 26 is a diagonal view of the prior art power module structure of FIG. 24 as its insulating plate is soldered to the heat plate.
Figure 27:
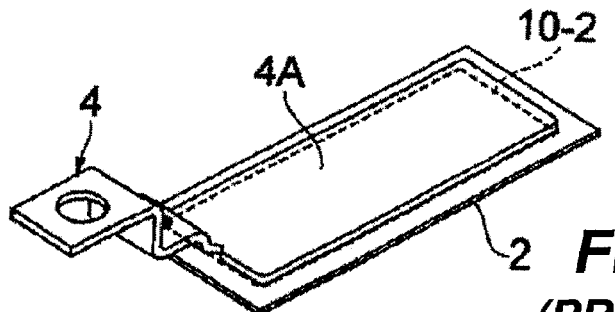
FIG. 27 is a diagonal view of the prior art power module structure of FIG. 24 as its first terminal is soldered to the insulating plate.
Figure 28:
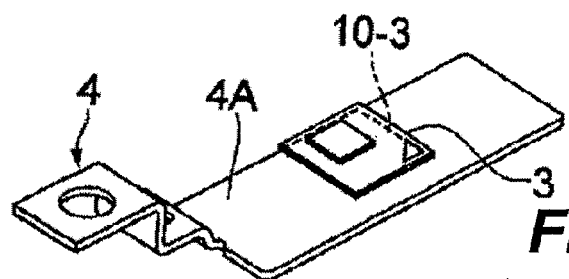
FIG. 28 is a diagonal view of the prior art power module structure of FIG. 24 as its semiconductor chip is soldered to the first terminal.
Figure 29:
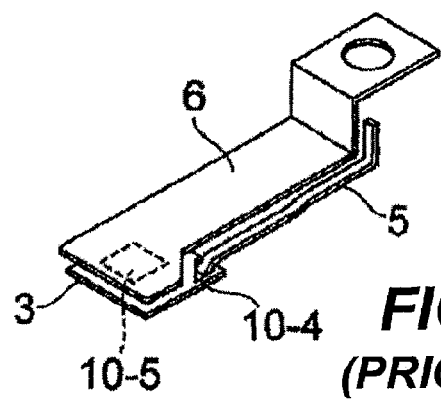
FIG. 29 is a diagonal view of the prior art power module structure of FIG. 24 as its second and third terminals are soldered to the semiconductor chip.
Figure 30:
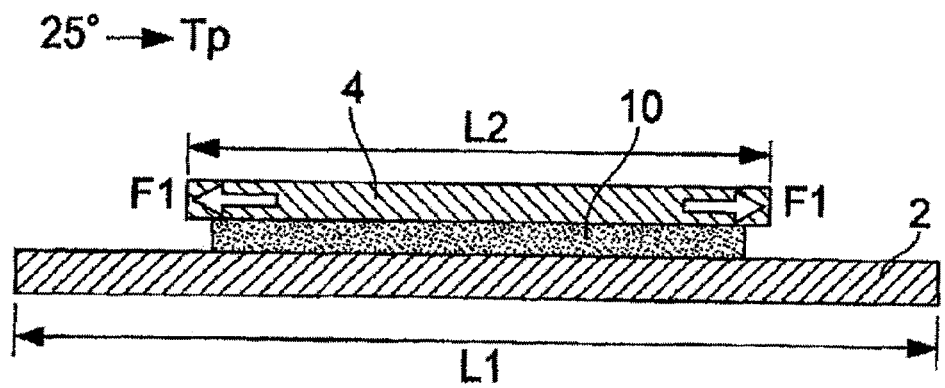
FIG. 30 is a schematic drawing showing the mechanism for warping between the insulating plate and the first terminal of a power module structure.
Figure 31:
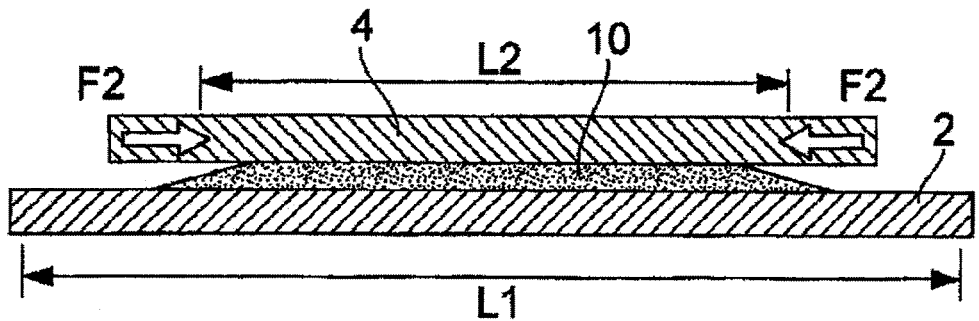
FIG. 31 is a schematic drawing showing the thermal expansion of the first terminal with respect to the insulating plate.
Figure 32:
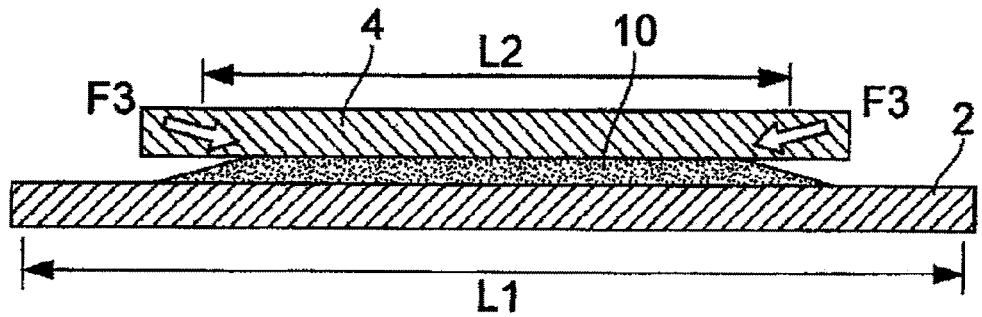
FIG. 32 is a schematic drawing showing the shrinking of the first terminal with respect to the insulating plate.
Figure 33:
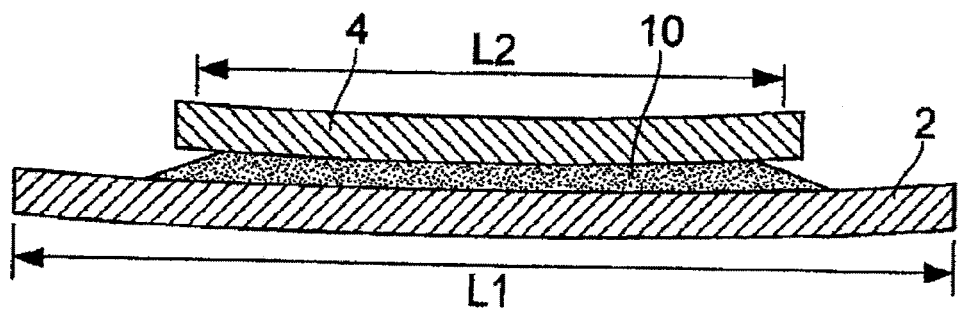
FIG. 33 is a schematic drawing showing the warping between the first terminal and the insulating plate.

FIG. 18 shows another example of heat plate 1-1 having its main body 1A divided into two parts 1a-1 and 1b-1 which are connected to each other through a solder portions 13 on both sides of the dividing part 1F to form shock absorber. FIG. 19 shows still another example having a slit 14 on one side to serve as shock absorber. FIG. 20 shows still another example having a slit 15 in the middle. FIG. 21 shows still another example having a groove 16 on the surface of its main body 1A in the longitudinal direction to serve as shock absorber. FIG. 22 shows still another example having two grooves 17 on the surface P1 of its main body 1A each perpendicularly to its longitudinal direction to serve as shock absorber. FIG. 23 shows still another example having a lattice pattern with two grooves 18 perpendicularly to the longitudinal direction of its main body 1A and three grooves 19 in the longitudinal direction on its surface P1. Each of these examples is soldered to the insulating plate 2-1 locally over a smaller soldering area than previously done.

What is claimed is:

1. A power module structure comprising:
   a heat plate for contacting a heat sink;
   an insulating plate soldered to said heat plate;
   a terminal soldered to said insulating plate; and
   a semiconductor chip having contact point corresponding to said terminal so as to contact said terminal through said contact point;
   wherein said terminal is provided with a shock absorbing part that serves to weaken a force generated due to the difference in coefficient of thermal expansion between said terminal and said insulating plate; and
   wherein said terminal has a force restricting part that serves to restrict said force and is locally formed as a soldering area through which said terminal is soldered to said insulating plate.

2. The power module structure of claim 1 wherein said force restricting part is formed on one side of said terminal.

3. The power module structure of claim 1 wherein said force restricting part is formed on each side of said terminal.

4. The power module structure of claim 1 wherein said shock absorbing part is formed as a plurality of slits provided to said terminal.

5. The power module structure of claim 1 wherein said terminal is divided into parts in a longitudinal direction of said terminal, said divided parts serving as said shock absorbing part, said divided parts being separately soldered to said insulating plate to thereby disperse said force restricting part.

6. The power module structure of claim 1 wherein said shock absorbing part is formed as a groove on a surface of said terminal facing said semiconductor chip.

7. The power module structure of claim 1 wherein said shock absorbing part is formed as a groove on a back surface of said terminal facing said insulating plate.

8. The power module structure of claim 1 wherein said heat plate includes shock absorbing portion that serves to weaken the a force generated due to the difference in coefficient of thermal expansion between said terminal and said insulating plate.

9. A solid state relay comprising:
a heat sink;
a base attached to an end surface of said heat sink; and
a power module structure which is contained in said base and makes a surface-contact with said heat sink, said power module structure comprising:
a heat plate contacting said heat sink;
an insulating plate soldered to said heat plate;
a terminal soldered to said insulating plate; and
a semiconductor chip having a contact point corresponding to said terminal so as to contact said terminal through said contact point;
wherein said terminal is provided with a shock absorbing part that serves to weaken a force generated due to the difference in coefficient of thermal expansion between said terminal and said insulating plate; and
wherein said terminal has a force restricting part that serves to restrict said force and is locally formed as a soldering area through which said terminal is soldered to said insulating plate.

10. The solid state relay of claim 9 wherein said force restricting part is formed on one side of said terminal.

11. The solid state relay of claim 9 wherein said force restricting part is formed on each side of said terminal.

12. The solid state relay of claim 9 wherein said shock absorbing part is formed as a plurality of slits provided to said terminal.

13. The solid state relay of claim 9 wherein said terminal is divided into parts in a longitudinal direction of said terminal, said divided parts serving as said shock absorbing part, said divided parts being separately soldered to said insulating plate to thereby disperse said force restricting part.

14. The solid state relay of claim 9 wherein said shock absorbing part is formed as a groove on a surface of said terminal facing said semiconductor chip.

15. The solid state relay of claim 9 wherein said shock absorbing part is formed as a groove on a back surface of said terminal facing said insulating plate.

16. The solid state relay of claim 9 wherein said heat plate includes shock absorbing portion that serves to weaken a force generated due to the difference in coefficient of thermal expansion between said terminal and said insulating plate.

* * * * *